United States Patent
Lanzillo et al.

(10) Patent No.: US 12,261,056 B2
(45) Date of Patent: Mar. 25, 2025

(54) TOP VIA PATTERNING USING METAL AS HARD MASK AND VIA CONDUCTOR

(71) Applicant: International Business Machines Corporation, Armonk, NY (US)

(72) Inventors: Nicholas Anthony Lanzillo, Wynantskill, NY (US); Huai Huang, Clifton Park, NY (US); Hosadurga Shobha, Niskayuna, NY (US); Lawrence A. Clevenger, Saratoga Springs, NY (US); Chanro Park, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 320 days.

(21) Appl. No.: 17/460,624

(22) Filed: Aug. 30, 2021

(65) Prior Publication Data
US 2023/0067493 A1  Mar. 2, 2023

(51) Int. Cl.
| H01L 21/3213 | (2006.01) |
| H01L 21/768 | (2006.01) |
| H01L 23/528 | (2006.01) |
| H01L 23/532 | (2006.01) |

(52) U.S. Cl.
CPC .. *H01L 21/32139* (2013.01); *H01L 21/76885* (2013.01); *H01L 23/5283* (2013.01); *H01L 23/53257* (2013.01)

(58) Field of Classification Search
CPC ......... H01L 21/32139; H01L 21/76885; H01L 23/5283; H01L 23/53257; H01L 21/76897
See application file for complete search history.

(56) References Cited

U.S. PATENT DOCUMENTS

| 6,083,824 A | 7/2000 | Tsai |
| 8,513,114 B2 | 8/2013 | Tagami |
| 10,049,920 B1 | 8/2018 | Anderson |
| 10,177,031 B2 | 1/2019 | Bao |
| 10,199,235 B2 | 2/2019 | Wu |
| 10,256,186 B2 | 4/2019 | Bonilla |
| 10,727,121 B2 | 7/2020 | Bruce |
| 10,867,854 B2 | 12/2020 | Raley |
| 10,886,176 B2 | 1/2021 | Kikuchi |

(Continued)

FOREIGN PATENT DOCUMENTS

| CN | 101207066 A | 6/2008 |
| CN | 108269730 A | 7/2018 |
| CN | 111834288 A * | 10/2020 |

OTHER PUBLICATIONS

Machine Translation of CN-111834288-A.*

(Continued)

*Primary Examiner* — Yara B Green
*Assistant Examiner* — Fakeha Sehar
(74) *Attorney, Agent, or Firm* — Robert R. Aragona

(57) ABSTRACT

A semiconductor structure comprising a substrate, a first metal layer on top of the substrate, a second metal layer on top of the first metal layer and a dielectric layer adjacent to the second metal layer and at least part of the first metal layer and on top of at least part of the first metal layer. The first metal layer includes a via. The width of the second metal layer is the same as the width of the via of the first metal layer.

8 Claims, 7 Drawing Sheets

(56) References Cited

U.S. PATENT DOCUMENTS

2007/0148944 A1    6/2007  Lee
2009/0131295 A1 *  5/2009  Cui
2016/0307793 A1 * 10/2016  Huang .............. H01L 23/53209
2020/0020626 A1 *  1/2020  Yang ................ H01L 23/53223

OTHER PUBLICATIONS

Wan et al., "Subtractive Etch of Ruthenium for Sub-5nm Interconnect," © 2018 IEEE International Interconnect Technology Conference (IITC), IBM Downloaded on May 8, 2021, pp. 1-3, doi: 10.1109/IITC.2018.8454841.

Disclosed Anonymously et al., "Method For A Cu Interconnects System With Low Line Resistivity and Enhanced EM Resistance", ip.com Prior Art Database Technical Disclosure, IPCOM000132112D, Dec. 1, 2005, pp. 1-7.

"Patent Cooperation Treaty PCT Notification of Transmittal of the International Search Report and the Written Opinion of the International Searching Authority, or the Declaration", Applicant's file reference IEE220405PCT, International application No. PCT/CN2022/095512, International filing date May 27, 2022 (May 27, 2022), Date of Mailing Aug. 9, 2022 (Aug. 9, 2022), 9 pages.

\* cited by examiner

TOP VIA PATTERNING USING METAL AS HARD MASK AND VIA CONDUCTOR

BACKGROUND OF THE INVENTION

The present invention relates generally to the field of semiconductor device manufacture and more particularly to top via patterning using metal as both a hard mask material and a via conductor.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

SUMMARY

Embodiments of the present invention disclose a semiconductor structure and methods of making the same. In a first embodiment, the invention discloses a semiconductor structure comprising a substrate, a first metal layer on top of the substrate, a second metal layer on top of the first metal layer and a dielectric layer adjacent to the second metal layer and at least part of the first metal layer and on top of at least part of the first metal layer. The first metal layer includes a via. The width of the second metal layer is the same as the width of the via of the first metal layer.

In a second embodiment, the invention discloses a semiconductor structure comprising a substrate, a first metal layer on top of the substrate, and a dielectric layer adjacent to at least part of the first metal layer and on top of at least part of the first metal layer. The first metal layer includes a via.

In a third embodiment, the invention discloses a method of forming a semiconductor structure. A first metal layer is deposited on a substrate. The first metal layer is etched to form one or more patterned lines. A sacrificial layer is deposited on top of the first metal layer. The sacrificial layer is etched to expose a part of the first metal layer and form one or more via. A second metal layer is deposited over the etched sacrificial layer and exposed first metal layer within the one or more via. The second metal layer is planarized to a height of the sacrificial layer. The sacrificial layer is removed. The first metal layer is etched using the second metal layer as a hard mask.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
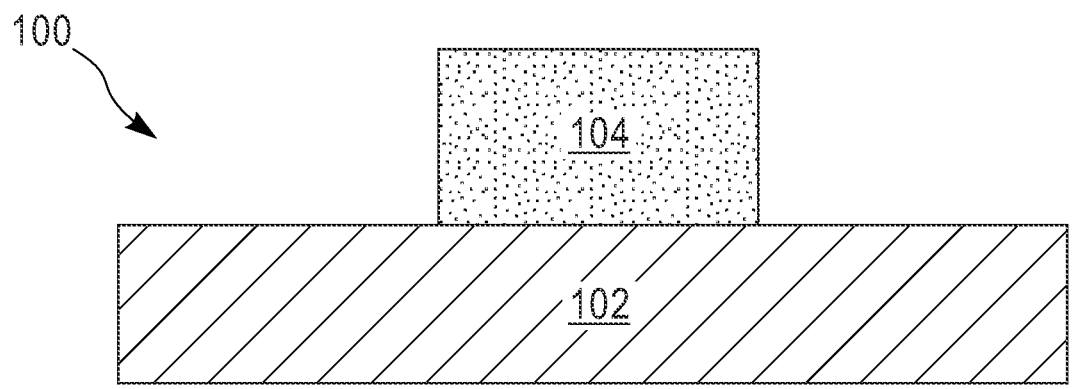
FIG. 1 depicts a cross-sectional view of a semiconductor structure with metal deposition upon a substrate to form a first metal layer in accordance with a first embodiment of the present invention.

Embodiments of the present invention recognize that top-via patterning uses a spin-on glass (SOG) dielectric as a patterning hard mask, which may suffer from pattern collapse (flopover) due to poor SOG-to-metal adhesion. Embodiments of the present invention use metal, instead of a dielectric, as both a hard mask material and a conductor in a top-via integration.

Embodiments of the present invention recognize that metal (for example, Copper (Cu) and Ruthenium (Ru) adhesions is about 2× stronger than dielectric and Ru adhesion. Embodiments of the present invention recognize that improved top-via integration can be done by eliminating via pillar flopover caused by spin-on dielectric instability due to better adhesions. Embodiments of the present invention provide for taller via height without deep via etch which leads to improved yield and reduced capacitance. Embodiments of the present invention enable subtractive top-via patterning and integration without tone inversion. Embodiments of the present invention enable a self-forming blocking boundary at the metal/Ru interface which improves EM lifetime.

Embodiments of the present invention may include structures and methods that could be used in interconnect 3.0 technology which be used next generation products that are beyond 5 nm sizing. Embodiments of the present invention provide a unique structure that has hybrid metal via metallization for the interconnect technology. Embodiments of the present invention recognize that by changing the hard mask material from a dielectric material to a metallic material, this enables the hard mask metallic material to be used as a conductor in the final structure. Embodiments of the present invention provide for using a metallic hard mask layer to define via regions during the subtractive metal etching of a conductive line. Embodiments of the present invention provide for using the metallic hard mask layer that is retained and having the retained metallic hard mask layer as a conductive via located above the patterned interconnect line.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

In an embodiment, the inventive structure/process would be implemented in structures that the minimum metal pitch would be less than 30 nm (corresponding to a 5 nm technology node). Here, taking a 30 nm pitch as a representative dimension, the height of first metal layer 104 would have a width equal to roughly half the pitch (about 15 nm), and a height of roughly equal to the pitch (about 30 nm). The width of the via 408 would be approximately half the pitch in each lateral dimension (15 nm×15 nm) while the height would be approximately equal to the pitch itself (about 15 nm). In an embodiment, each of the height of first metal layer 104, width of first metal layer 104, and width of via 408 may vary as much as half the size (0.5×) or one and a half times the size (1.5×) depending on the specific interconnect architecture being implemented. In an alternative embodiment, the inventive structure/process could be implemented in structures that have a smaller metal pitch, and as such, all sizing would become smaller as the pitch itself becomes smaller.

FIGS. 1-10 depict a structure and method of top via patterning using meta as both a hard mask material and via conductor, in accordance with a first embodiment of the invention.

FIG. 1 depicts a cross-sectional view of a semiconductor structure 100 with metal deposition upon a substrate 102 to form a first metal layer 104 in accordance with a first embodiment of the present invention. In an embodiment, substrate 102 may be a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, first metal layer 104 may be Ruthenium (Ru). In an embodiment, substrate 102 may be a level of interconnect wiring located below first metal layer 104. For example, modern semiconductor chips may have fifteen or more levels of interconnect wiring, labeled M1-M15, so if this structure was to be used at the M2 metal level, in other words M2 metal level as first metal layer 104, then the M1 metal level would be located below it. In an embodiment, first metal layer 104 may be Ruthenium (Ru). In an alternative embodiment, first metal layer 104 may be Copper (Cu), Cobalt (Co), Molybdenum (Mo), Iridium (Jr), Rhodium (Rh), Platinum (Pt), and Tungsten (W), or any other metal which has the ability to be subtractively etched using reactive ion etching (RIE). In an embodiment, first metal layer 104 may be deposited using any deposition technique known in the art, such as, for example, chemical vapor deposition, plasma enhanced chemical vapor deposition, atomic layer deposition, or physical vapor deposition.

Figure 2:
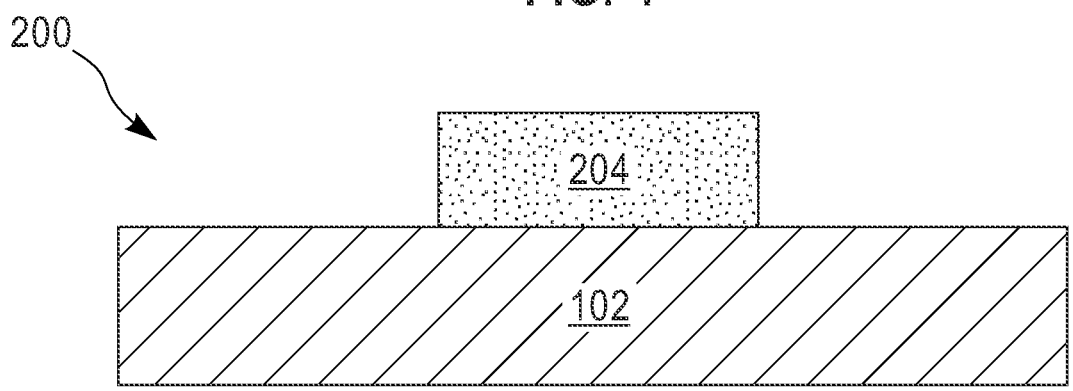
FIG. 2 depicts a cross-sectional view of the semiconductor structure with a portion of the first metal layer etched to form patterns of lines in accordance with a first embodiment of the present invention.

FIG. 2 depicts a cross-sectional view of the semiconductor structure 200 with a portion of the first metal layer 104 etched to form patterns of lines in accordance with a first embodiment of the present invention. In an embodiment, first metal layer 204 is etched to form a pattern of lines on top of substrate 102. As depicted, FIG. 2 first metal layer 204 is etched to a single line on top of substrate 102. As noted above, in an embodiment, metal layer 204 may be 15 nm wide and 30 nm height relative to the top of substrate 102. In an alternative embodiment, metal layer 204 may be 10-20 nm wide and 10-40 nm in height relative to the top of substrate 102. In yet another alternative embodiment, first metal layer 204 may be any width suitable and any height suitable relative to the top of substrate 102.

Figure 3:
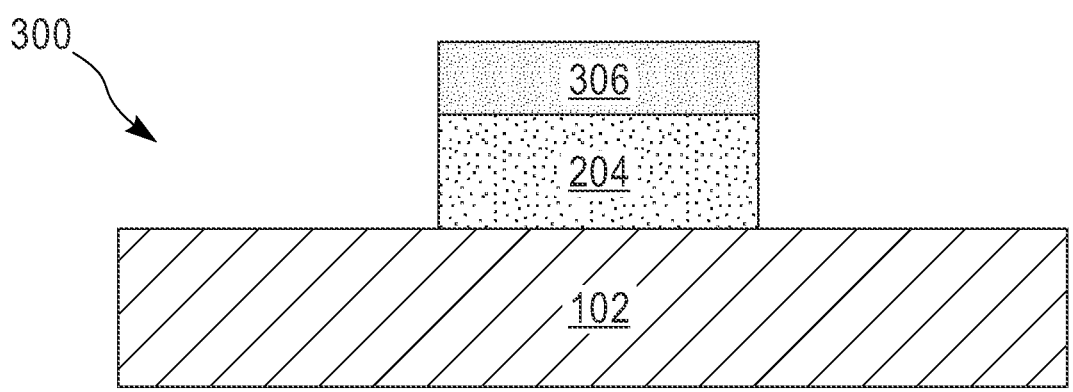
FIG. 3 depicts a cross-sectional view of the semiconductor structure after depositing a sacrificial layer on top of the first metal layer in accordance with a first embodiment of the present invention.

FIG. 3 depicts a cross-sectional view of the semiconductor structure 300 after depositing a sacrificial layer 306 on top of the first metal layer 204 in accordance with a first embodiment of the present invention. As depicted, FIG. 3 includes a sacrificial layer 306 deposited using any deposition technique known in the art, such as, for example, chemical vapor deposition, plasma enhanced chemical vapor deposition, atomic layer deposition, or physical vapor deposition. In an embodiment, sacrificial layer 306 maybe a sacrificial nitride material. In an embodiment, sacrificial layer 306 may be, SiCN, SiN, or any other material known in the art. In an embodiment, the sacrificial layer 306 may be 15 nm to 45 nm in thickness. In an embodiment, the sacrificial layer 306 thickness is relative to the height of the via being created and therefore, the sacrificial layer 306 may be anywhere from 50% to 150% the pitch. For example, a structure with a 30 nm pitch, the via height may be anywhere from 15 nm to 45 nm.

Figure 4:
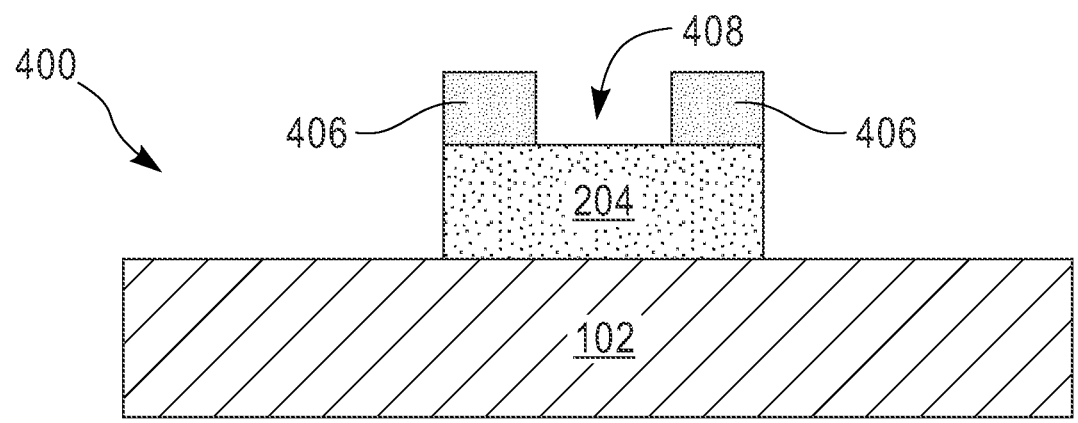
FIG. 4 depicts a cross-sectional view of the semiconductor structure after etching to form a via in the sacrificial layer in accordance with a first embodiment of the present invention.

FIG. 4 depicts a cross-sectional view of the semiconductor structure 400 after etching to form a via 408 in the sacrificial layer 306 in accordance with a first embodiment of the present invention. As depicted, FIG. 4 includes sacrificial layer 306 etched to form two sacrificial layers 406 and via 408. In an embodiment, sacrificial layer 306 may be etched to form two sacrificial layers 406 and via 408 using any known techniques in the art, including, but not limited to wet etching and dry etching. Additionally, in an embodiment, a lithography step may be needed in order to pattern the via 408 within the sacrificial layer 306.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes. In an embodiment, the lithography step may done using extreme ultraviolet lithograph (EUV) in order to pattern the via 408.

In an embodiment, the width and length of via 408 may be less than 10 nm. In an alternative embodiment, the width and length of via 408 may be 15 nm×15 nm. In yet another alternative embodiment, the width and length of via 408 may be any size suitable for the pitch discussed above. In yet another alternative embodiment, via 408 may be shaped in an oval, square, rectangle, or any other shape known in the art.

Figure 5:
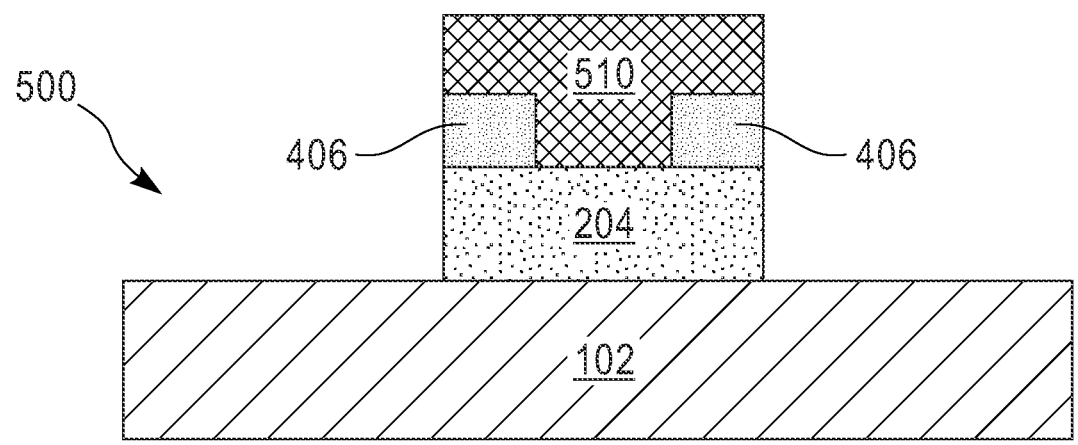
FIG. 5 depicts a cross-sectional view of the semiconductor structure after depositing a second metal layer over the sacrificial layer and exposed first metal layer in the via opening in accordance with a first embodiment of the present invention.

FIG. 5 depicts a cross-sectional view of the semiconductor structure 500 after depositing a second metal layer 510 over the sacrificial layers 406 and exposed first metal layer 204 in the via 408 opening in accordance with a first embodiment of the present invention. As depicted, FIG. 5 includes second metal layer 510 deposited in via opening 408, adjacent to sacrificial layers 406, and on top of sacrificial layers 406. In an embodiment, the second metal layer 510 may be Copper (Cu). In an alternative embodiment, the second metal layer 510 may be Cobalt (Co). In yet another embodiment, the second metal layer 510 may be any metal known in the art, including but not limited to, Mo, Jr, Rh, Pt, and W, as long as the second metal layer 510 is not made of the same material as the first metal layer 204.

Figure 6:
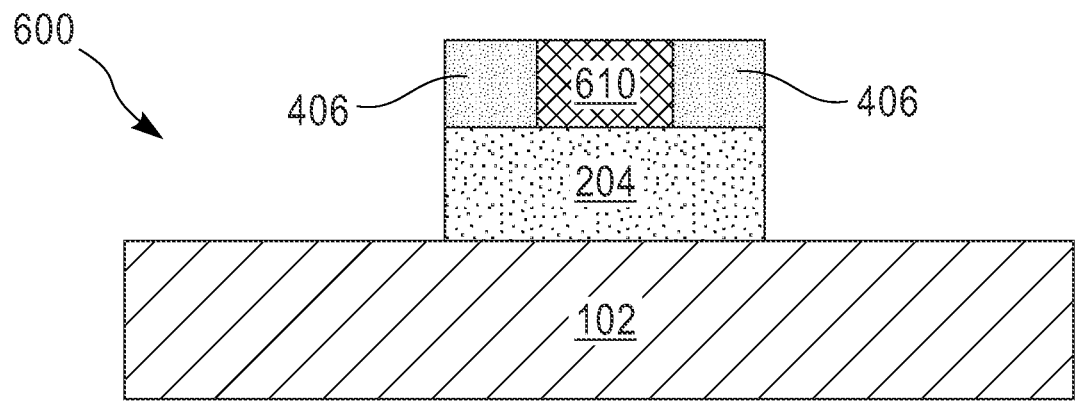
FIG. 6 depicts a cross-sectional view of the semiconductor structure after the second metal layer and/or sacrificial layer are planarized in accordance with a first embodiment of the present invention.

FIG. 6 depicts a cross-sectional view of the semiconductor structure 600 after the second metal layer 610 and/or sacrificial layers 406 are planarized in accordance with a first embodiment of the present invention. As depicted, FIG. 6. includes second metal layer 610 and/or sacrificial layers 406 removed and planarized using known removal and planarize technique known in the art, such as, for example, using chemical mechanical polishing (CMP), grinding, or any combination thereof.

As an example, in the CMP process, the CMP removes excess second metal layer 510 above sacrificial layer 406 using the top surface of the sacrificial layers 406 as a CMP stop. After the CMP, the top surface of semiconductor structure 600 is flat and the top surface of second metal layer 510 is level with the top surface of sacrificial layers 406.

Figure 7:
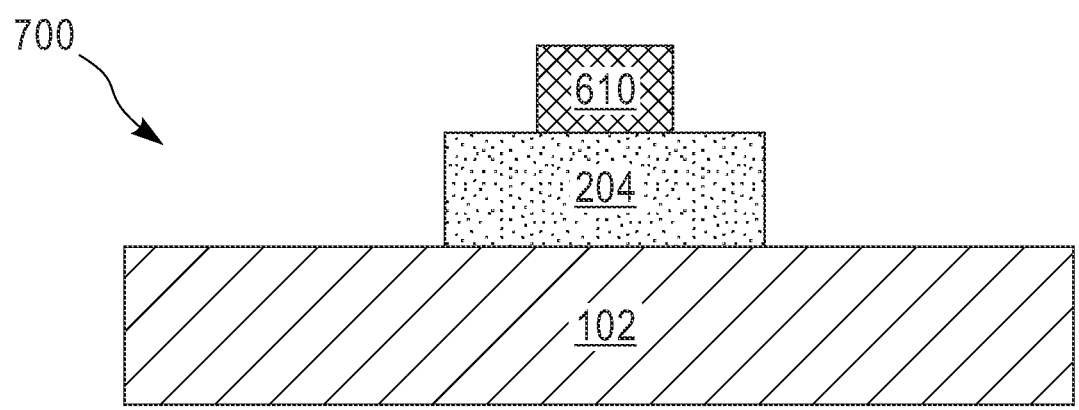
FIG. 7 depicts a cross-sectional view of the semiconductor structure after removal of the sacrificial layer in accordance with a first embodiment of the present invention.

FIG. 7 depicts a cross-sectional view of the semiconductor structure 700 after removal of the sacrificial layers 406 in accordance with a first embodiment of the present invention. As depicted, FIG. 7 includes the elements of FIG. 6 but with the removal of sacrificial layers 406 to expose the second metal layer 610. Sacrificial layers 406 may be removed using any known removal technique known in the art, such as, for example, wet etching, dry etching, reactive ion etching or any combination therefore.

Figure 8:
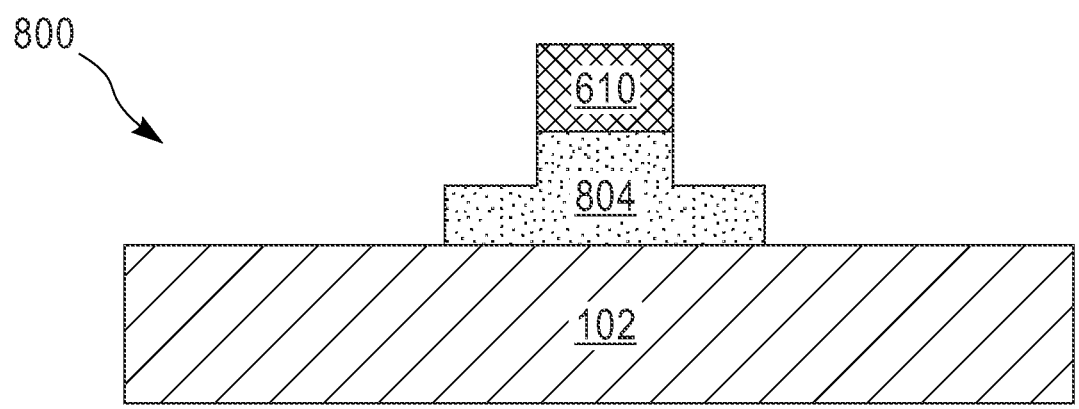
FIG. 8 depicts a cross-sectional view of the semiconductor structure after etching the first metal layer using the second metal layer as a hard mask to form a via in accordance with a first embodiment.

FIG. 8 depicts a cross-sectional view of the semiconductor structure 800 after etching the first metal layer 804 using the second metal layer 610 as a hard mask to form a via in accordance with a first embodiment. FIG. 8 includes second metal layer 610 as a hard mask that outlines the shape of etched first metal layer 804. As depicted, FIG. 8 includes an etched first metal layer 804 that is partially an original shape of first metal layer 804 and partially a shape of the second metal layer 610 due to the hard mask. As depicted, FIG. 8 includes a first metal layer 804 that now has two separate vertical side walls on each side of the first metal layer 804 along with two separate horizontal top planes and a single horizontal bottom plane. First metal layer 804 is etched using any etching technique known in the art, such as, for example, chloride based metal etching to form the via by using the second metal layer 810 as a hard mask.

Figure 9:
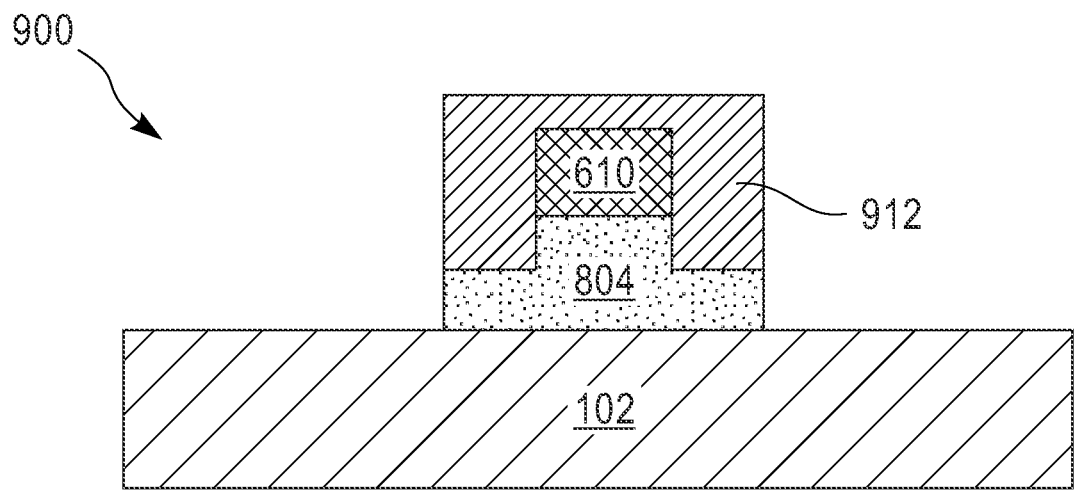
FIG. 9 depicts a cross-sectional view of a semiconductor structure after deposition of a dielectric layer over the first metal layer and the second metal layer in accordance with a first embodiment of the present invention.

FIG. 9 depicts a cross-sectional view of a semiconductor structure 900 after deposition of a dielectric layer 912 on top of the first metal layer 804 and the second metal layer 610 in accordance with a first embodiment of the present invention. As depicted, FIG. 9 includes dielectric layer 912 after deposition including sidewalls of both the exposed first metal layer 804 and exposed second metal layer 610. Embodiments of the present invention provide several methods of depositing a dielectric layer 912 over the first metal layer 804 and second metal layer 610. The dielectric layer 912 can be a silicon oxide, a spin-on-oxide, a nitride, or another insulating material, such as a spin-on-glass may be deposited. The deposition may occur by, but not limited to, plasma-enhanced chemical vapor deposition (PECVD), physical vapor deposition (PVD), atomic layer deposition, a spin-on-process, or using a flowable oxide material.

Figure 10:
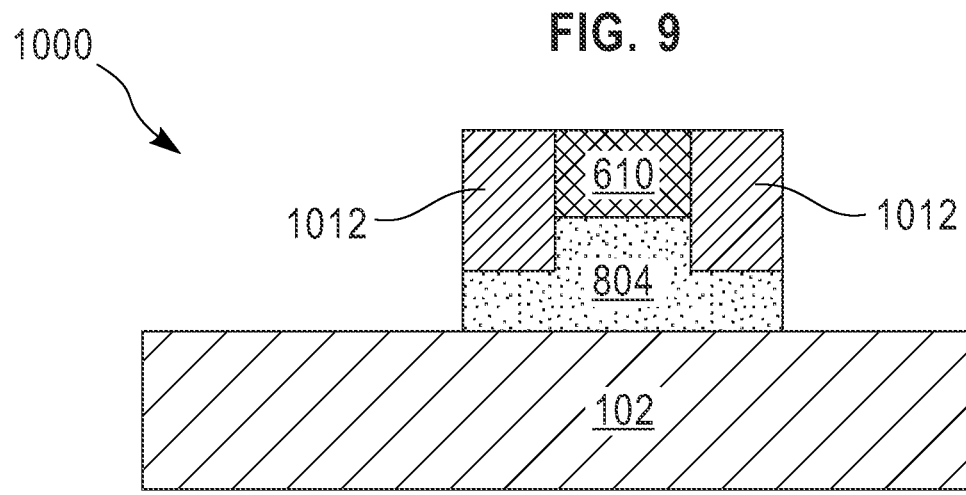
FIG. 10 depicts a cross-sectional view of the semiconductor structure after the second metal layer and/or dielectric layer are planarized in accordance with a first embodiment of the present invention.

FIG. 10 depicts a cross-sectional view of the semiconductor structure 1000 after the second metal layer 610 and/or dielectric layer 912 are planarized in accordance with a first embodiment of the present invention. As depicted, FIG. 10. includes second metal layer 610 and/or dielectric layer 912 removed and planarized using known removal and planarize technique known in the art, such as, for example, using chemical mechanical polishing (CMP), grinding, or any combination thereof. As depicted, FIG. 10. Includes dielectric layers 1012 formed after removal and planarization.

As an example, in the CMP process, the CMP removes excess dielectric layer 912 above second metal layer 610 using the top surface of the second metal layer 610 as a CMP stop. After the CMP, the top surface of semiconductor structure 1000 is flat and the top surface of second metal layer 610 is level with the top surface of dielectric layers 1012.

Figure 11:
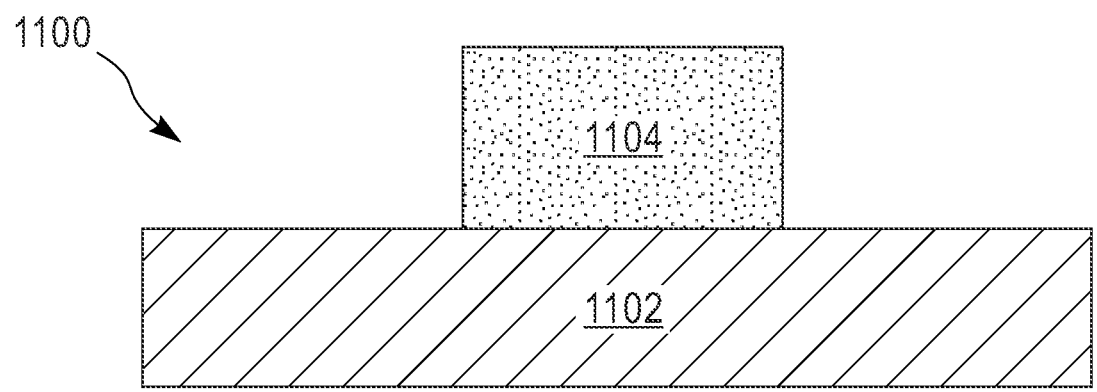
FIG. 11 depicts a cross-sectional view of a semiconductor structure with metal deposition upon a substrate to form a first metal layer in accordance with a second embodiment of the present invention.

FIG. 11 depicts a cross-sectional view of a semiconductor structure 1100 with metal deposition upon a substrate 1102 to form a first metal layer 1104 in accordance with a second embodiment of the present invention. In an embodiment, substrate 1102 may be a bulk semiconductor, a layered semiconductor substrate such as Si/SiGe, a silicon-on-insulator substrate (SOI), or a SiGe-on-insulator substrate (SGOI). The substrate 1102 may include any semiconducting material, such as, for example, undoped Si, n-doped Si, p-doped Si, single crystal Si, polycrystalline Si, amorphous Si, Ge, SiGe, SiC, SiGeC, Ga, GaAs, InAs, InP, or any other III/V or II/VI compound semiconductors. In an embodiment, first metal layer 1104 may be Ruthenium (Ru). In an embodiment, substrate 1102 may be a level of interconnect wiring located below first metal layer 1104. For example, modern semiconductor chips may have fifteen or more levels of interconnect wiring, labeled M1-M15, so if this structure was to be used at the M2 metal level, in other words M2 metal level as first metal layer 1104, then the M1 metal level would be located below it. In an embodiment, first metal layer 1104 may be Ruthenium (Ru). In an alternative embodiment, first metal layer 1104 may be Copper (Cu), Cobalt (Co), Molybdenum (Mo), Iridium (Jr), Rhodium (Rh), Platinum (Pt), and Tungsten (W), or any other metal which has the ability to be subtractively etched using reactive ion etching (RIE). In an embodiment, first metal layer 1104 may be deposited using any deposition technique known in the art, such as, for example, chemical vapor deposition, plasma enhanced chemical vapor deposition, atomic layer deposition, or physical vapor deposition.

Figure 12:
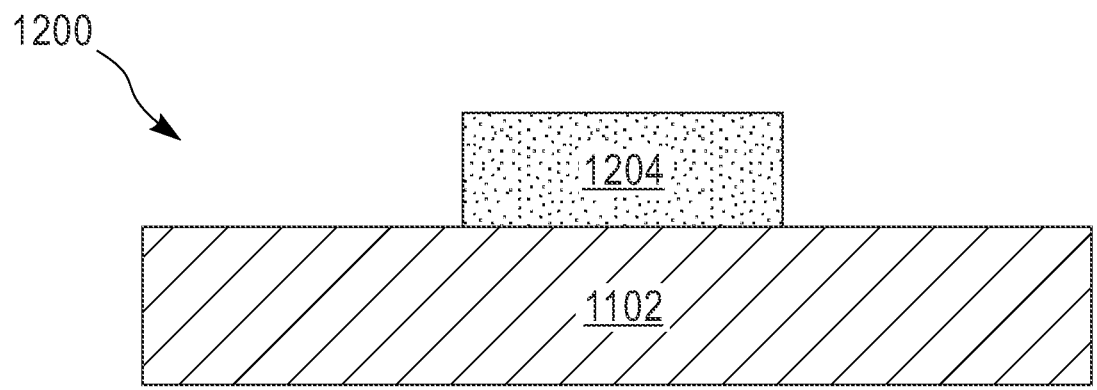
FIG. 12 depicts a cross-sectional view of the semiconductor structure with a portion of the first metal layer etched to form patterns of lines in accordance with a second embodiment of the present invention.

FIG. 12 depicts a cross-sectional view of the semiconductor structure 1200 with a portion of the first metal layer 1104 etched to form patterns of lines in accordance with a second embodiment of the present invention. In an embodiment, first metal layer 1204 is etched to form a pattern of lines on top of substrate 1102. As depicted, FIG. 12 first metal layer 1204 is etched to a single line on top of substrate 1102. As noted above, in an embodiment, metal layer 1204 may be 15 nm wide and 30 nm height relative to the top of substrate 1102. In an alternative embodiment, metal layer 1204 may be 10-20 nm wide and 10-40 nm in height relative to the top of substrate 1102. In yet another alternative embodiment, first metal layer 1204 may be any width suitable and any height suitable relative to the top of substrate 1102.

Figure 13:
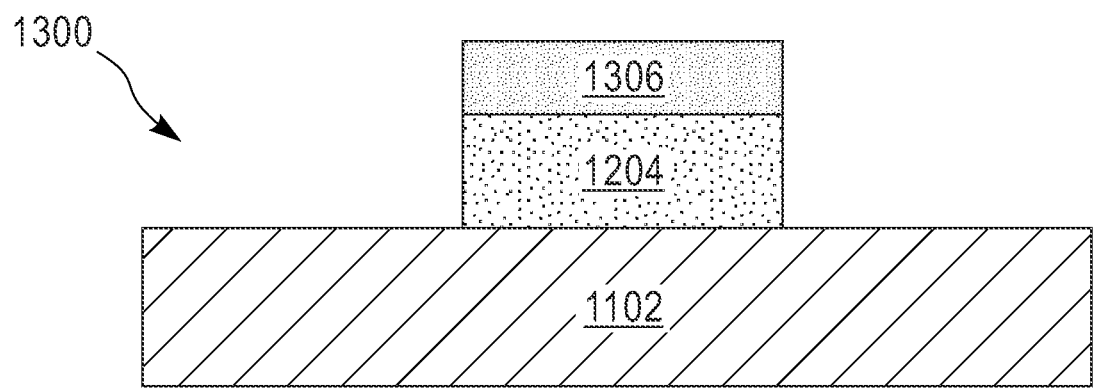
FIG. 13 depicts a cross-sectional view of the semiconductor structure after depositing a sacrificial layer on top of the first metal layer in accordance with a second embodiment of the present invention.

FIG. 13 depicts a cross-sectional view of the semiconductor structure 1300 after depositing a sacrificial layer 1306 on top of the first metal layer 1204 in accordance with a second embodiment of the present invention. As depicted, FIG. 13 includes a sacrificial layer 1306 deposited using any deposition technique known in the art, such as, for example, chemical vapor deposition, plasma enhanced chemical vapor deposition, atomic layer deposition, or physical vapor deposition. In an embodiment, sacrificial layer 1306 maybe a sacrificial nitride material. In an embodiment, sacrificial layer 1306 may be, SiCN, SiN, or any other material known in the art. In an embodiment, the sacrificial layer 1306 may be 15 nm to 45 nm in thickness. In an embodiment, the sacrificial layer 1306 thickness is relative to the height of the via being created and therefore, the sacrificial layer 1306 may be anywhere from 50% to 150% the pitch. For example, a structure with a 30 nm pitch, the via height may be anywhere from 15 nm to 45 nm.

Figure 14:
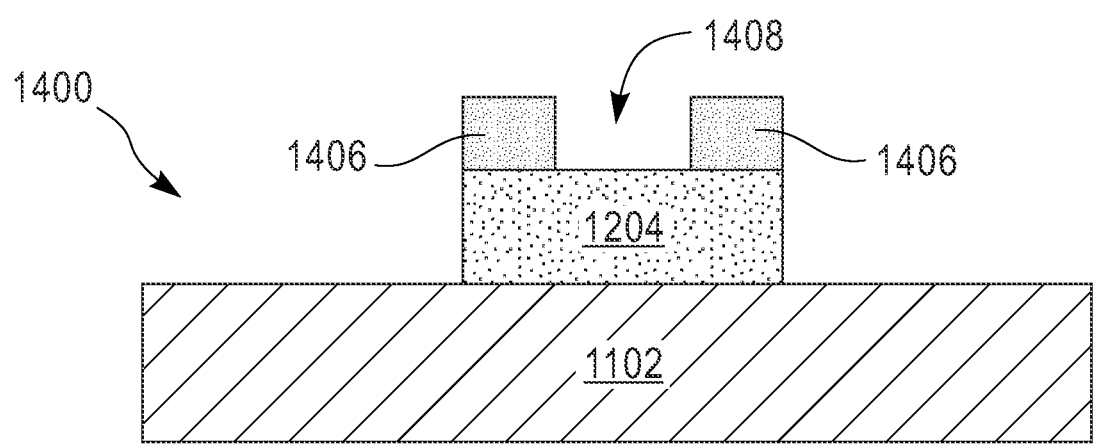
FIG. 14 depicts a cross-sectional view of the semiconductor structure after etching to form a via in the sacrificial layer in accordance with a second embodiment of the present invention.

FIG. 14 depicts a cross-sectional view of the semiconductor structure 1400 after etching to form a via 1408 in the sacrificial layer 1306 in accordance with a second embodiment of the present invention. As depicted, FIG. 14 includes sacrificial layer 1306 etched to form two sacrificial layers 1406 and via 1408. In an embodiment, sacrificial layer 1306 may be etched to form two sacrificial layers 1406 and via 1408 using any known techniques in the art, including, but not limited to wet etching and dry etching. Additionally, in an embodiment, a lithography step may be needed in order to pattern the via 1408 within the sacrificial layer 1306.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes. In an embodiment, the lithography step may done using extreme ultraviolet lithograph (EUV) in order to pattern the via 1408.

Figure 15:
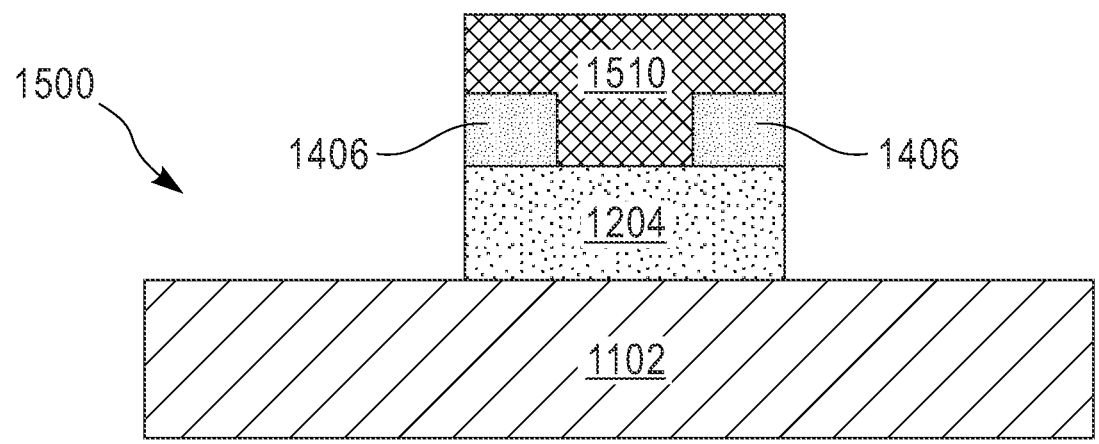
FIG. 15 depicts a cross-sectional view of the semiconductor structure after depositing a second metal layer over the sacrificial layer and exposed first metal layer in the via opening in accordance with a second embodiment of the present invention.

FIG. 15 depicts a cross-sectional view of the semiconductor structure 1500 after depositing a second metal layer 1510 over the sacrificial layer 1406 and exposed first metal layer 1204 in the via opening in accordance with a second embodiment of the present invention. As depicted, FIG. 15 includes second metal layer 1510 deposited in via opening 1408, adjacent to sacrificial layers 1406, and on top of sacrificial layers 1406. In an embodiment, the second metal layer 1510 may be Copper (Cu). In an alternative embodiment, the second metal layer 1510 may be Cobalt (Co). In yet another embodiment, the second metal layer 1510 may be any metal known in the art, including but not limited to, Mo, Jr, Rh, Pt, and W, as long as the second metal layer 1510 is not made of the same material as the first metal layer 1204.

Figure 16:
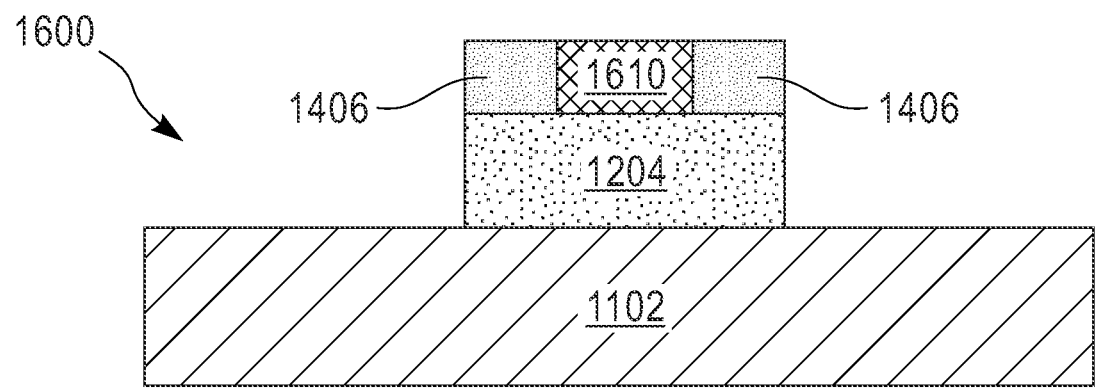
FIG. 16 depicts a cross-sectional view of the semiconductor structure after the second metal layer and/or sacrificial layer are planarized in accordance with a second embodiment of the present invention.

FIG. 16 depicts a cross-sectional view of the semiconductor structure 1600 after the second metal layer 1610 and/or sacrificial layer 1406 are planarized in accordance with a second embodiment of the present invention. As depicted, FIG. 16. includes second metal layer 1610 and/or sacrificial layers 1406 removed and planarized using known removal and planarize technique known in the art, such as, for example, using chemical mechanical polishing (CMP), grinding, or any combination thereof.

As an example, in the CMP process, the CMP removes excess second metal layer 1510 above sacrificial layer 406 using the top surface of the sacrificial layers 1406 as a CMP stop. After the CMP, the top surface of semiconductor structure 1600 is flat and the top surface of second metal layer 1610 is level with the top surface of sacrificial layers 1406.

Figure 17:
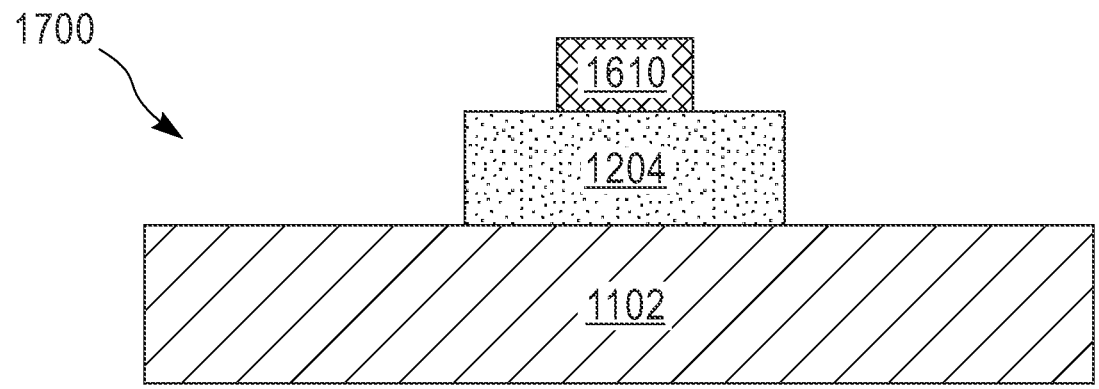
FIG. 17 depicts a cross-sectional view of the semiconductor structure after removal of the sacrificial layer in accordance with a second embodiment of the present invention.

FIG. 17 depicts a cross-sectional view of the semiconductor structure 1700 after removal of the sacrificial layer 1406 in accordance with a second embodiment of the present invention. As depicted, FIG. 17 includes the elements of FIG. 16 but with the removal of sacrificial layers 1406 to expose the second metal layer 1610. Sacrificial layers 1406 may be removed using any known removal technique known in the art, such as, for example, wet etching, dry etching, reactive ion etching or any combination therefore.

Figure 18:
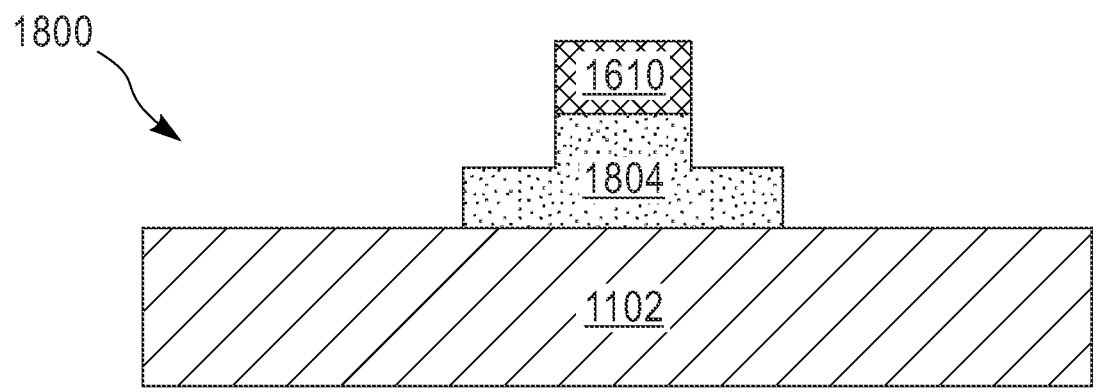
FIG. 18 depicts a cross-sectional view of the semiconductor structure after etching the first metal layer using the second metal layer as a hard mask to form a via in accordance with a second embodiment.

FIG. 18 depicts a cross-sectional view of the semiconductor structure 1800 after etching the first metal layer 1804 using the second metal layer 1610 as a hard mask to form a via in accordance with a second embodiment. FIG. 18 includes second metal layer 1610 as a hard mask that outlines the shape of etched first metal layer 1804. As depicted, FIG. 18 includes an etched first metal layer 1804 that is partially an original shape of first metal layer 1804 and partially a shape of the second metal layer 1610 due to the hard mask. As depicted, FIG. 18 includes a first metal layer 1804 that now has two separate vertical side walls on each side of the first metal layer 1804 along with two separate horizontal top planes and a single horizontal bottom plane. First metal layer 1804 is etched using any etching technique known in the art, such as, for example, chloride based metal etching to form the via by using the second metal layer 1810 as a hard mask.

Figure 19:
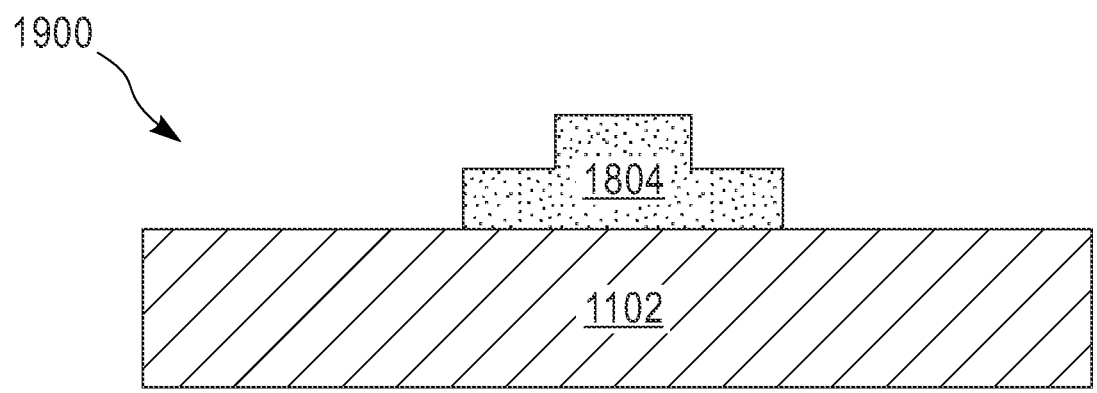
FIG. 19 depicts a cross-sectional view of the semiconductor structure after removing the second metal layer in accordance with a second embodiment.

FIG. 19 depicts a cross-sectional view of the semiconductor structure 1900 after removing the second metal layer 1610 in accordance with a second embodiment. As depicted, second metal layer 1610 is removed using any known removal technique known in the art, such as, for example, wet etching. For example, etch-k and/or etch-j may be used as a form of wet etching to remove the second metal layer 1610. As depicted, FIG. 19 first metal layer 1804 is now exposed on top of the surface of the first metal layer 1804 and side walls of the first metal layer 1804 that form the via. As depicted, FIG. 19 includes a first metal layer 1804 that now has two separate vertical side walls on each side of the first metal layer 1804 along with two separate horizontal top planes and a single horizontal bottom plane.

Figure 20:
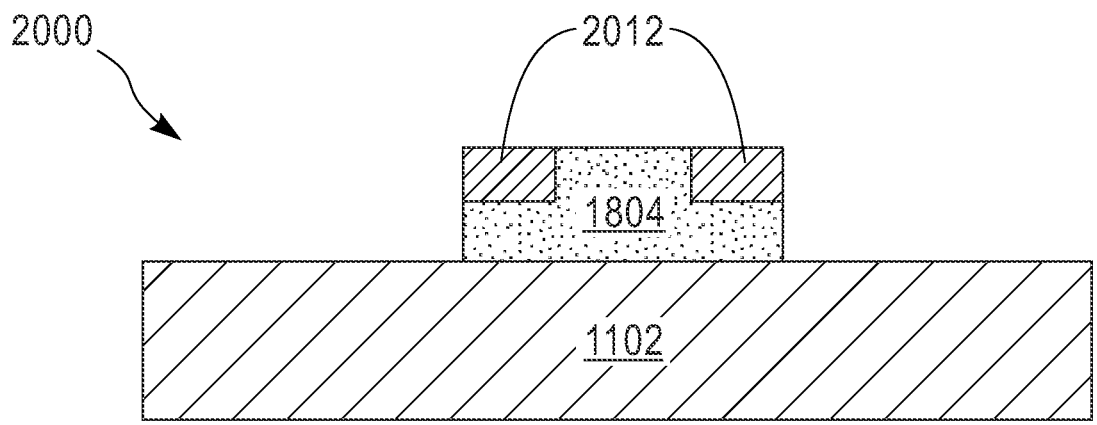
FIG. 20 depicts a cross-sectional view of the semiconductor structure after depositing a dielectric layer over the first metal layer then removing and planarizing the dielectric layer and the first metal layer in accordance with a second embodiment.

FIG. 20 depicts a cross-sectional view of the semiconductor structure 2000 after depositing a dielectric layer 2012 over the first metal layer 1804 then removing and planarizing the dielectric layer 2012 and the first metal layer 1804 in accordance with a second embodiment. As depicted, FIG. 20 includes dielectric layer 2012 after deposition and planarization. Embodiments of the present invention provide several methods of depositing a dielectric layer 2012 over the first metal layer 1804. The dielectric layer 2012 can be a silicon oxide, a spin-on-oxide, a nitride, or another insulating material, such as a spin-on-glass may be deposited. The deposition may occur by, but not limited to, plasma-enhanced chemical vapor deposition (PECVD), physical vapor deposition (PVD), atomic layer deposition, a spin-on-process, or using a flowable oxide material.

As depicted, FIG. 20. includes dielectric layer 2012 and the first metal layer 1804 removed and planarized using known removal and planarize technique known in the art, such as, for example, using chemical mechanical polishing (CMP), grinding, or any combination thereof. As an example, in the CMP process, the CMP removes excess dielectric layer 2012 above first metal layer 1804 using the top surface of the first metal layer 1804 as a CMP stop. After the CMP, the top surface of semiconductor structure 2000 is flat and the top surface of dielectric layers 2012 are level with the top surface of first metal layer 1804.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure, the semiconductor structure comprising:
    a substrate;
    a first metal layer on top of the substrate, wherein the first metal layer includes a lower portion and a via connected to the lower portion, wherein the via is comprised of a same material as the lower portion;
    a second metal layer on top of the first metal layer and in direct contact with the via of the first metal layer, wherein a width of the second metal layer is the same as a width of the via of the first metal layer, wherein the second metal layer is comprised of a different material than the first metal layer; and
    a dielectric layer in direct contact with sidewalls of the second metal layer and a portion of sidewalls of the first metal layer and on top of at least part of the first metal layer, wherein outer sidewalls of the dielectric layer are flush with sidewalls of the lower portion of the first metal layer.

2. The semiconductor structure of claim 1, wherein the first metal layer is Ruthenium (Ru).

3. The semiconductor structure of claim 1, wherein the second metal layer is Copper (Cu).

4. The semiconductor structure of claim 1, wherein the second metal layer is Cobalt (Co).

5. The semiconductor structure of claim 1, wherein the first metal layer is selected form the group consisting of Copper (Cu), Cobalt (Co), Molybdenum (Mo), Iridium (Ir), Rhodium (Rh), Platinum (Pt), and Tungsten (W).

6. The semiconductor structure of claim 1, wherein the width of the via is less than 10 nm and wherein a length of the via is less than 10 nm.

7. The semiconductor structure of claim 1, wherein the via is created using the second metal layer as a hard mask.

8. The semiconductor structure of claim 3, wherein the dielectric layer is in direct contact with the sidewalls of the Copper second metal layer and the portion of the sidewalls of the first metal layer and on top of the at least part of the first metal layer, wherein the outer sidewalls of the dielectric layer are flush with the sidewalls of the lower portion of the first metal layer.

* * * * *